(12) United States Patent
Adachi et al.

(10) Patent No.: US 11,728,630 B2
(45) Date of Patent: Aug. 15, 2023

(54) METHOD OF ELECTRIC WIRE ROUTING

(71) Applicant: YAZAKI CORPORATION, Tokyo (JP)

(72) Inventors: Hideki Adachi, Makinohara (JP); Yuji Migimatsu, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 297 days.

(21) Appl. No.: 17/151,069

(22) Filed: Jan. 15, 2021

(65) Prior Publication Data

US 2021/0226426 A1    Jul. 22, 2021

(30) Foreign Application Priority Data

Jan. 16, 2020  (JP) ................................ 2020-005396

(51) Int. Cl.
*H02G 1/06* (2006.01)
*H01B 13/012* (2006.01)
*H05K 5/02* (2006.01)

(52) U.S. Cl.
CPC ............. *H02G 1/06* (2013.01); *H01B 13/012* (2013.01); *H05K 5/0247* (2013.01); *Y10T 29/49194* (2015.01)

(58) Field of Classification Search
CPC .......... H01B 13/012; H02G 1/06; H02G 3/16; H05K 5/0247; Y10T 29/49194
See application file for complete search history.

(56) References Cited

U.S. PATENT DOCUMENTS

| 5,338,014 | A |  | 8/1994 | Kitamura |  |
|---|---|---|---|---|---|
| 6,086,037 | A | * | 7/2000 | Nagy | B29C 33/405 249/91 |
| 6,615,486 | B1 | * | 9/2003 | Takada | H01R 43/0249 29/748 |
| 8,033,243 | B2 | * | 10/2011 | Bolyard, Jr. | B65H 57/16 118/325 |
| 8,225,498 | B2 | * | 7/2012 | Lin | H01B 13/01227 29/748 |
| 9,484,130 | B2 | * | 11/2016 | Metche | H01B 13/01245 |
| 2013/0118778 | A1 | * | 5/2013 | Takahashi | B60R 16/0215 174/154 |

FOREIGN PATENT DOCUMENTS

| JP | H05-38725 U | 5/1993 |  |
|---|---|---|---|
| JP | H6-76638 A | 3/1994 |  |
| JP | 2007-174870 A | 7/2007 |  |
| WO | WO-2017090470 A1 * | 6/2017 | ........... H01B 13/012 |

* cited by examiner

*Primary Examiner* — Peter Dungba Vo
*Assistant Examiner* — Jose K Abraham
(74) *Attorney, Agent, or Firm* — Kenealy Vaidya LLP (57) ABSTRACT

A method of electric wire routing includes: routing an electric wire in an electric wire routing path which is provided in a case and has a concave shape in a cross-sectional view; and covering an upper portion of the electric wire routing path with a cover. A pair of guide pins are inserted into a through hole formed in a bottom portion of the electric wire routing path in the case from below to a position above a side wall portion which forms the electric wire routing path. The electric wire is passed between the guide pins. The cover is assembled to the upper portion of the electric wire routing path while the guide pins are pulled out from the through hole.

3 Claims, 9 Drawing Sheets

METHOD OF ELECTRIC WIRE ROUTING

CROSS REFERENCE TO RELATED APPLICATIONS

This application is based on and claims priority from Japanese patent application No. 2020-005396 filed on Jan. 16, 2020, the entire contents of which are incorporated herein by reference.

TECHNICAL FIELD

The present invention relates to a method of electric wire routing.

BACKGROUND ART

As a method of fixing a protector to a wire harness, there is a method of fixing a loose portion of an electric wire of the wire harness in the protector in a gathered state by arranging the wire harness between holding pins formed on the protector (see, for example, Patent Literature 1).

CITATION LIST

Patent Literature

[Patent Document 1] JP-A-H6-76638

According to the routing method described above, by holding the electric wire of the wire harness with the holding pins, the electric wire can be prevented from being caught when a lid is mounted. However, according to the routing method described above, it is necessary to prepare the protector where the erected holding pins are provided, which leads to an increase in costs.

SUMMARY OF INVENTION

A method of electric wire routing according to an embodiment is capable of easily routing an electric wire relative to a case while preventing the increase in the costs.

A method of electric wire routing according to an embodiment comprises:

routing an electric wire in an electric wire routing path which is provided in a case and has a concave shape in a cross-sectional view; and covering an upper portion of the electric wire routing path with a cover.

In the method of electric wire routing, a pair of guide pins are inserted into a through hole formed in a bottom portion of the electric wire routing path in the case from below to a position above a side wall portion which forms the electric wire routing path.

In the method of electric wire routing, the electric wire is passed between the guide pins.

In the method of electric wire routing, the cover is assembled to the upper portion of the electric wire routing path while the guide pins are pulled out from the through hole.

BRIEF DESCRIPTION OF DRAWINGS

FIGS. 5A and 5B show an electric wire holding mechanism of the electric wire routing device.

FIGS. 7A to 7D show a procedure of routing the electric wire in the electric wire routing path of the case.

FIGS. 9A and 9B show a method of routing an electric wire to the case according to the reference example.

DESCRIPTION OF EMBODIMENTS

A specific embodiment according to the present invention will be described below with reference to drawings.

Figure 1:
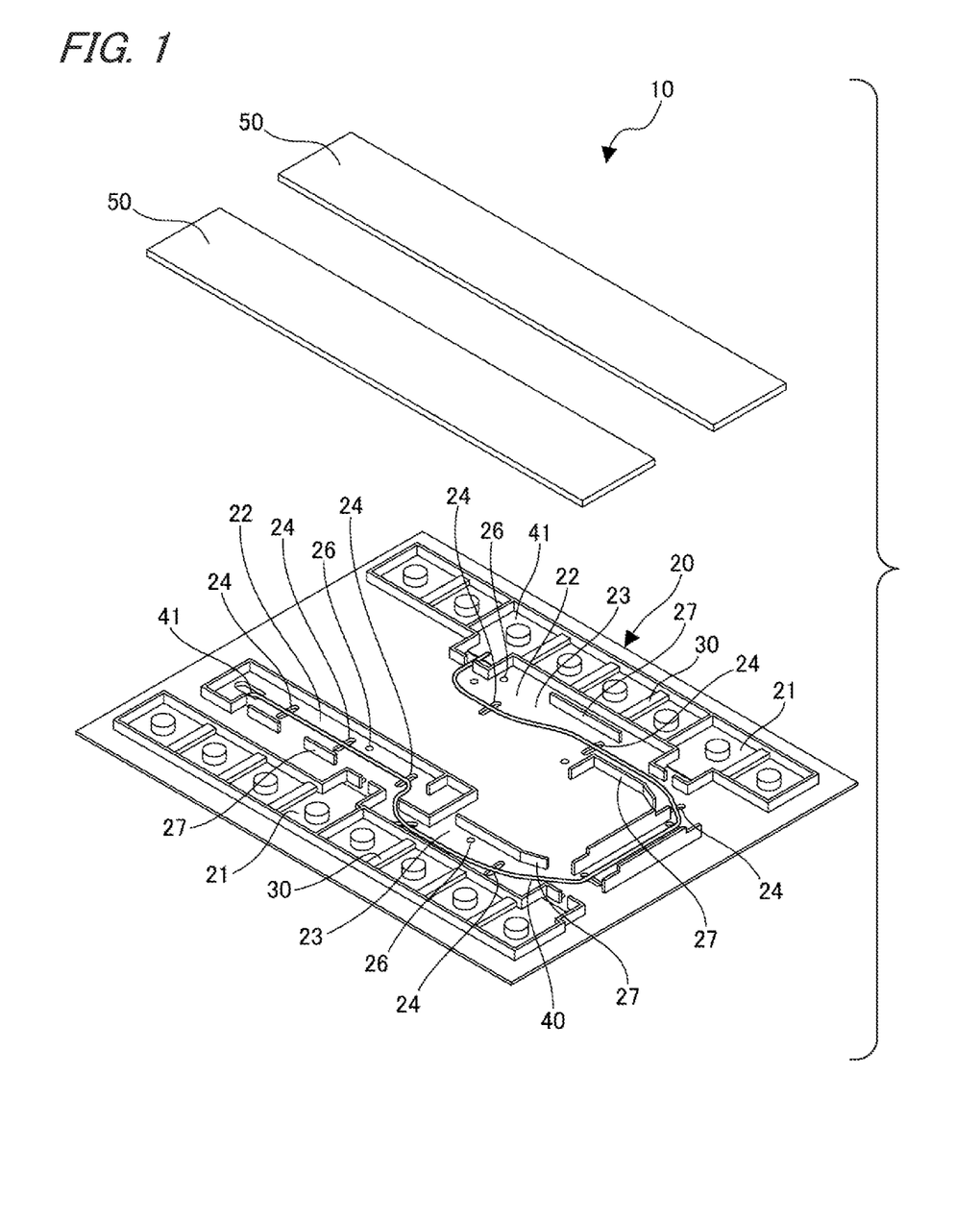
FIG. 1 is a perspective view showing a busbar module where an electric wire is routed based on a method of electric wire routing according to the present embodiment.

FIG. 1 is a perspective view showing a busbar module where an electric wire is routed based on a method of electric wire routing according to the present embodiment.

As shown in FIG. 1, a busbar module 10 includes a case 20, a busbar 30, an electric wire 40, and a cover 50. The case 20 is formed of, for example, a synthetic resin or the like, and includes a plurality of busbar accommodating portions 21 which are arranged in two rows. Each busbar accommodating portion 21 is formed in a frame shape, and the busbar 30 is accommodated in the busbar accommodating portion 21.

The busbar module 10 is assembled, for example, to an upper portion of a vehicle battery (not shown). The busbar 30 accommodated in the busbar accommodating portion 21 is fastened to an electrode of the battery and is conducted.

In the case 20, an electric wire routing path 22 is provided between the two rows of the busbar accommodating portions 21. The electric wire 40 is routed in the electric wire routing path 22. A plurality of through holes 24 are formed in a bottom portion 23 of the electric wire routing path 22. Such through holes 24 are long holes elongated in a direction that is orthogonal to a routing route of the electric wire 40. The case 20 also includes a plurality of positioning holes 26.

The electric wire 40 is, for example, an aluminum electric wire obtained by covering an aluminum conductor with an insulating resin. A connection terminal 41 is connected to an end portion of the electric wire 40 by, for example, ultrasonic bonding. The connection terminal 41 is accommodated in the busbar accommodating portion 21 together with each busbar 30. The electric wire 40 is an electric wire used for voltage detection or the like, and is electrically connected to the busbar 30 by tightening the connection terminal 41 together with the electrode of the battery. The electric wire 40 is connected to a control circuit board (not shown) which includes a voltage monitoring circuit or the like. As a result, the battery can monitor a voltage of the battery by the voltage monitoring circuit.

A cover 50 which is formed in a plate shape is mounted to the case 20 from above. When the cover 50 is mounted to the case 20, the electric wire routing path 22 is closed by the cover 50.

Figure 2:
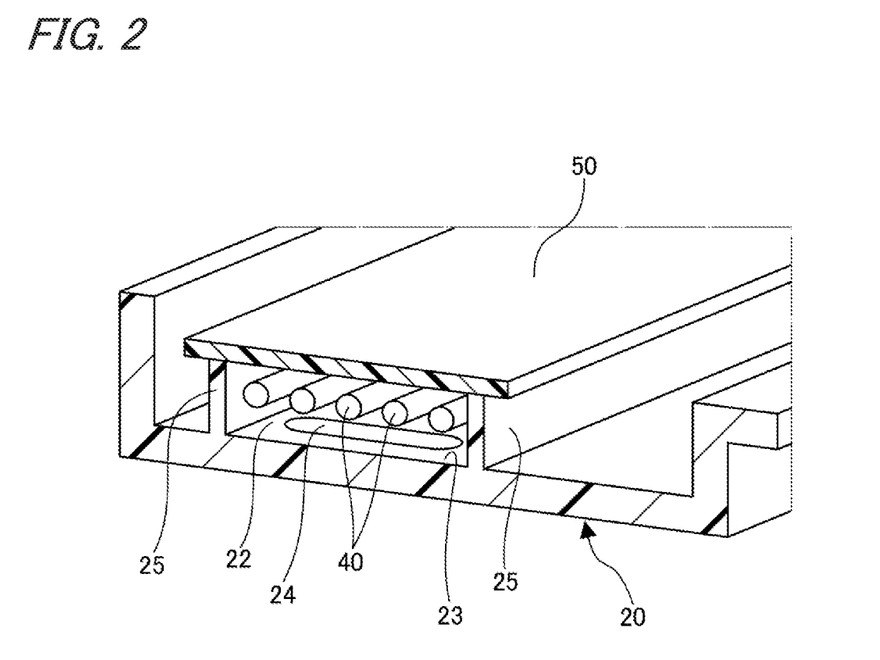
FIG. 2 is a perspective view showing an electric wire routing path of the busbar module in a cross-sectional view.
Figure 3:
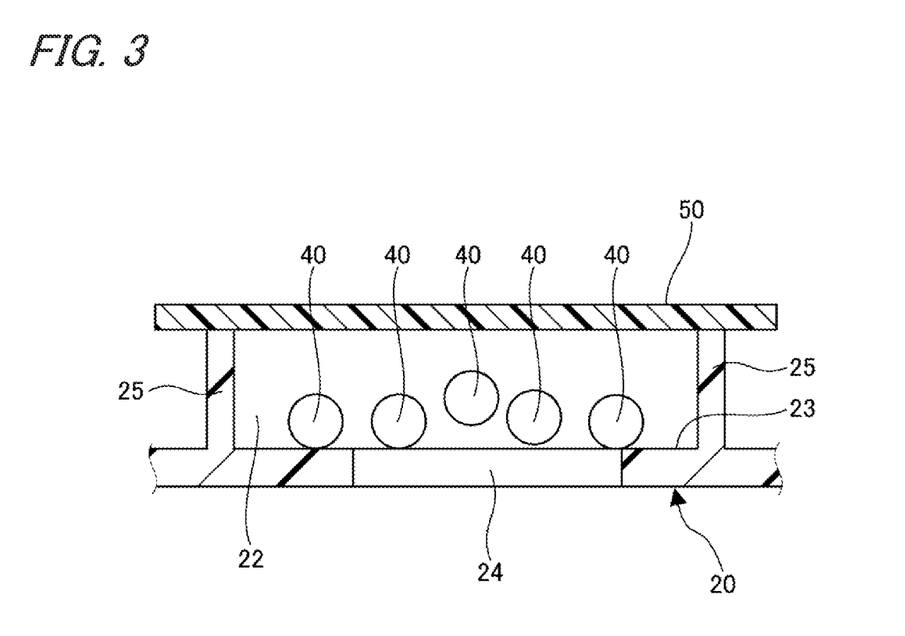
FIG. 3 is a cross-sectional view showing the electric wire routing path of the busbar module.

FIG. 2 is a perspective view showing the electric wire routing path of the busbar module in a cross-sectional view. FIG. 3 is a cross-sectional view showing the electric wire routing path of the busbar module.

As shown in FIGS. 2 and 3, the electric wire routing path 22 of the case 20 includes side wall portions 25 on two side portions thereof. As a result, the electric wire routing path 22 is formed in a concave shape constituted by the bottom portion 23 and the side wall portions 25. An upper side of the electric wire routing path 22 formed in the concave shape is closed by the cover 50 which is mounted on an upper portion thereof. As a result, the electric wire 40 accommodated in the electric wire routing path 22 is held in the case 20.

As shown in FIG. 1, electric wire restricting ribs 27 are formed on the bottom portion 23 in the electric wire routing path 22 of the case 20. The electric wire restricting ribs 27 are provided upright on an inner side relative to the side wall portions 25 that form the electric wire routing paths 22. The electric wire restricting ribs 27 are formed along the side wall portions 25, and are lower in height than the side wall portions 25. The electric wire 40 is routed in the electric wire routing path 22, and the routing route of the electric wire 40 is restricted by the electric wire restricting ribs 27 in the electric wire routing path 22.

When the electric wire 40 is routed in the electric wire routing path 22 of the case 20, an electric wire routing device is used. Hereinafter, the electric wire routing device will be described.

Figure 4:
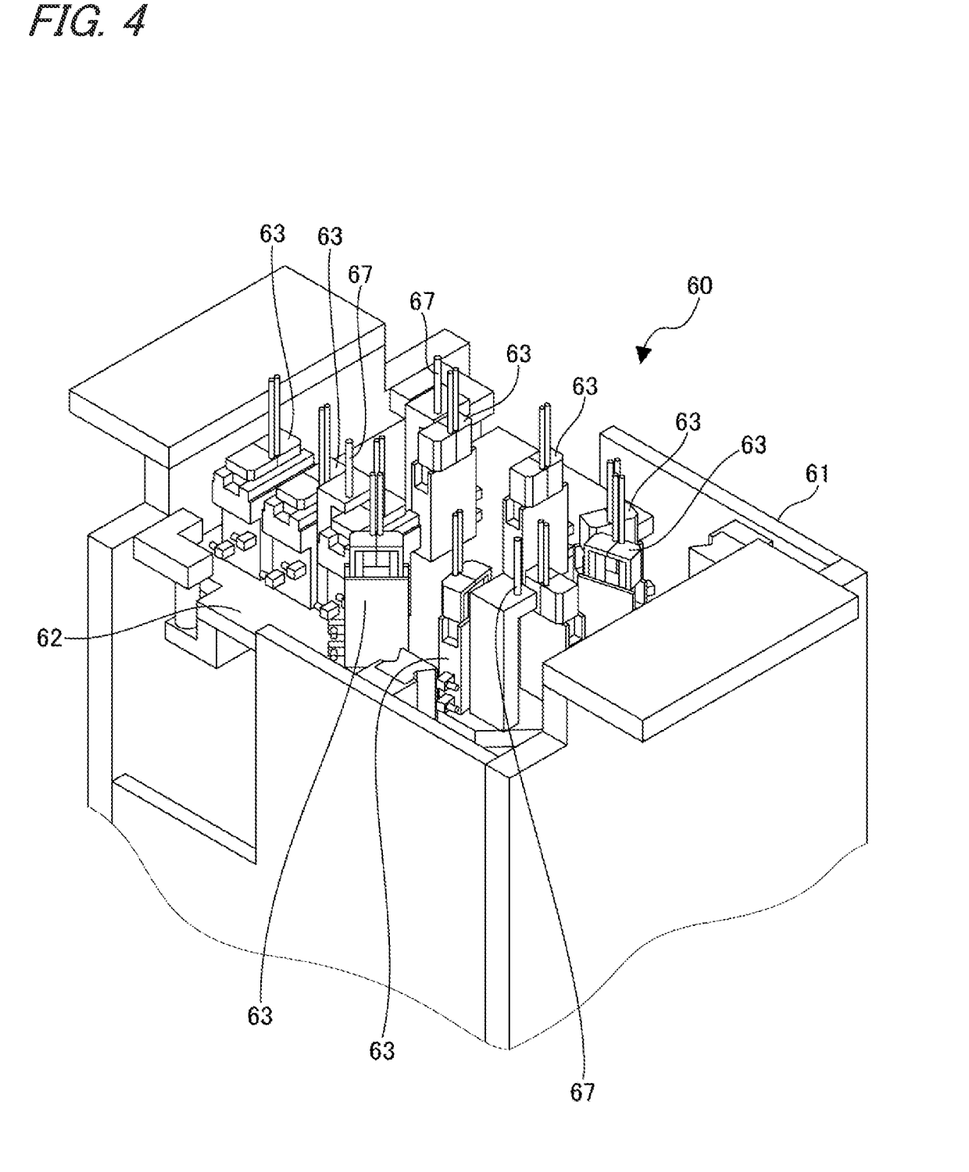
FIG. 4 is a perspective view showing an electric wire routing device configured to route the electric wire in the electric wire routing path.
Figure 5A:
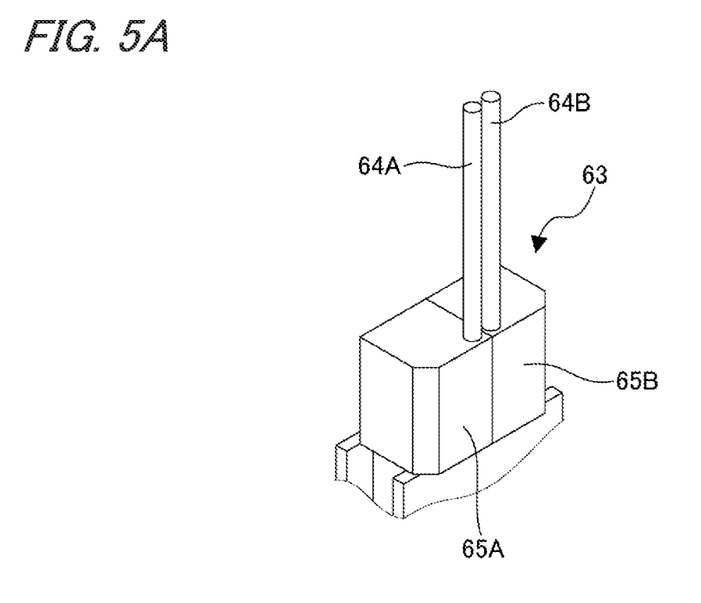
FIG. 5A is a perspective view showing a state where guide pins are arranged at positions close to each other.
Figure 5B:
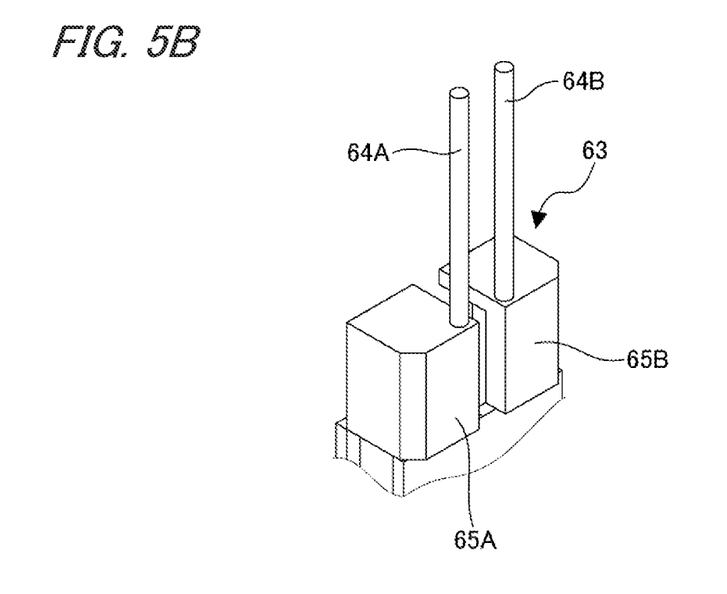
FIG. 5B is a perspective view showing a state where the guide pins are arranged at positions separated from each other.

FIG. 4 is a perspective view showing the electric wire routing device configured to route the electric wire in the electric wire routing path. FIGS. 5A and 5B show an electric wire holding mechanism of the electric wire routing device. FIG. 5A is a perspective view showing a state where guide pins are arranged at positions close to each other, and FIG. 5B is a perspective view showing a state where the guide pins are arranged at positions separated from each other.

As shown in FIG. 4, the electric wire routing device 60 includes a pedestal 61, and the case 20 is placed on the pedestal 61. The pedestal 61 includes an elevation portion 62 that can be lifted and lowered. The elevation portion 62 includes a driving unit (not shown) such as an air cylinder, and is lifted and lowered by supplying air to the driving unit. The elevation portion 62 is provided with a plurality of electric wire holding mechanisms 63. A plurality of positioning pins 67 are erected on the elevation portion 62 provided on the pedestal 61.

As shown in FIGS. 5A and 5B, each electric wire holding mechanism 63 includes a fixed block 65A and a movable block 65B that can be moved in a direction in which the movable block 65B is brought close to and away from the fixed block 65A by a driving unit (not shown) such as an air cylinder. Guide pins 64A and 64B are erected on the fixed block 65A and the movable block 65B, respectively.

As shown in FIG. 5B, in the electric wire holding mechanism 63, the movable block 65B is brought close to (see FIG. 5A) and away from (see FIG. 5B) the fixed block 65A such that the other guide pin 64B is brought close to and away from the one guide pin 64A.

Next, a procedure of using the electric wire routing device 60 to route the electric wire in the case 20 will be described.

Figure 6:
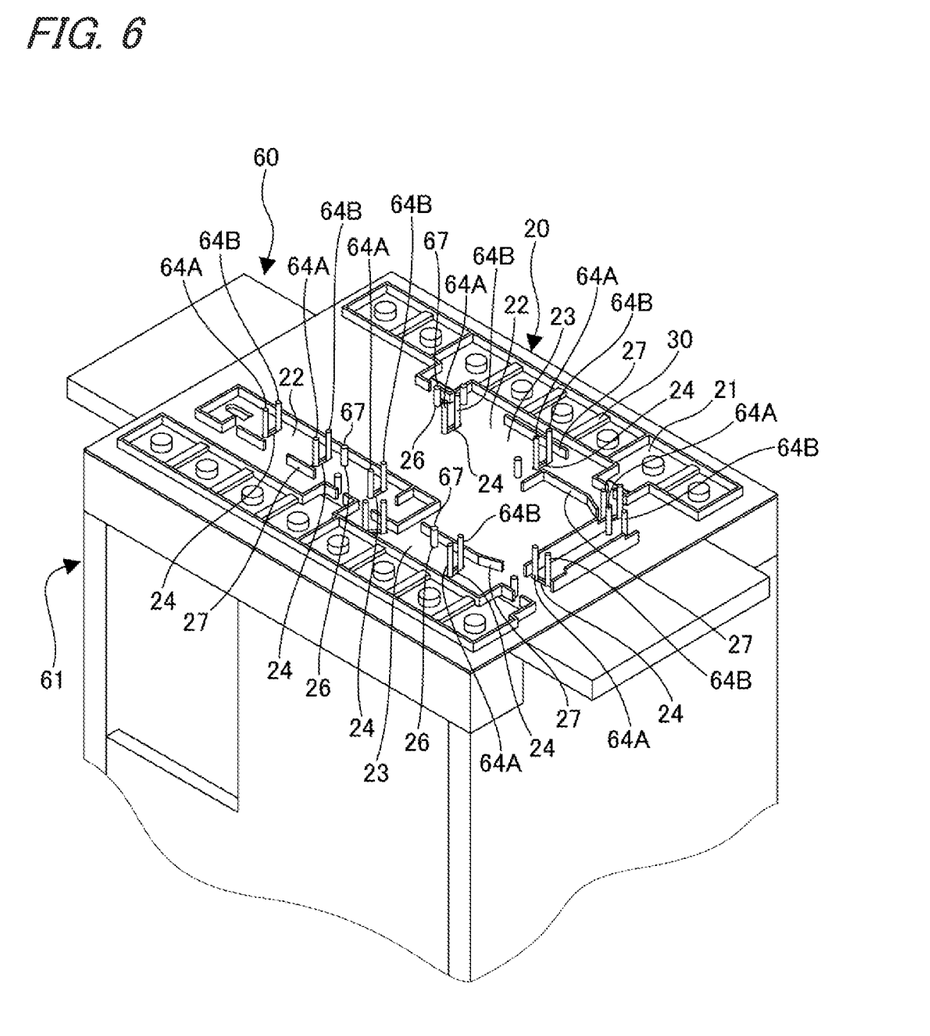
FIG. 6 is a perspective view showing the electric wire routing device where a case of the busbar module is placed.

FIG. 6 is a perspective view showing the electric wire routing device where the case of the busbar module is placed. FIGS. 7A to 7D show a procedure of routing the electric wire in the electric wire routing path of the case. FIGS. 7A to 7D are cross-sectional views showing the electric wire routing path, respectively.

As shown in FIG. 6, the case 20 is placed on an upper portion of the electric wire routing device 60, and the elevation portion 62 is lifted. Then the positioning pin 67 is inserted into the positioning hole 26 of the case 20 such that the case 20 is positioned relative to the electric wire routing device 60. Moreover, the pair of guide pins 64A and 64B of the electric wire holding mechanism 63 are inserted into each of the through holes 24 of the case 20.

Figure 7A:
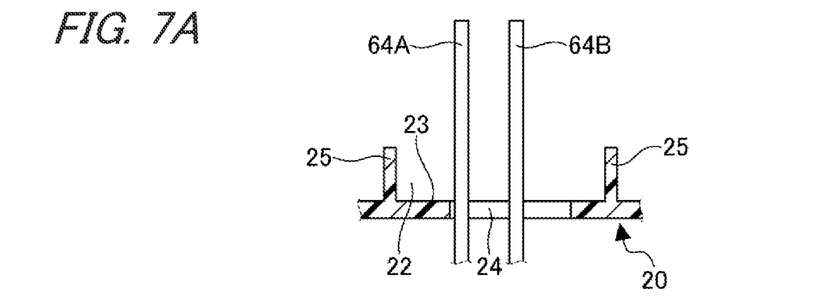
FIGS. 7A to 7D are cross-sectional views showing the electric wire routing path, respectively.

As shown in FIG. 7A, the pair of guide pins 64A and 64B, which are inserted into the through hole 24 of the case 20, are arranged at an interval that is slightly wider than a diameter of the electric wire 40 while tip ends thereof are arranged above upper edges of the side wall portions 25 of the case 20.

Figure 7B:
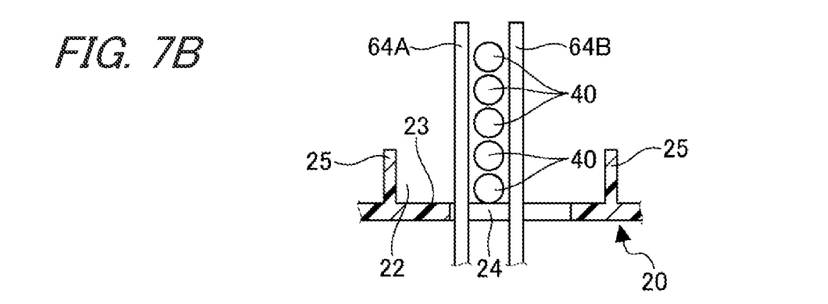

As shown in FIG. 7B, the electric wires 40 are inserted between the guide pins 64A and 64B. Then the electric wires 40 are held in a state of being stacked in an up-down direction between the guide pins 64A and 64B at a width direction intermediate portion of the electric wire routing path 22.

Figure 7C:
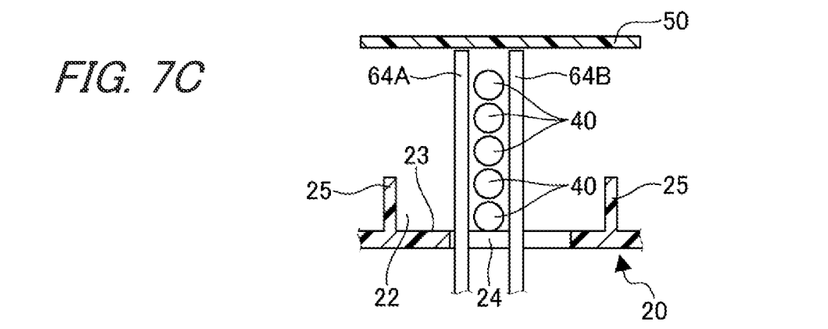

As shown in FIG. 7C, the cover 50 that covers the upper portion of the electric wire routing path 22 is arranged from above the case 20.

Figure 7D:
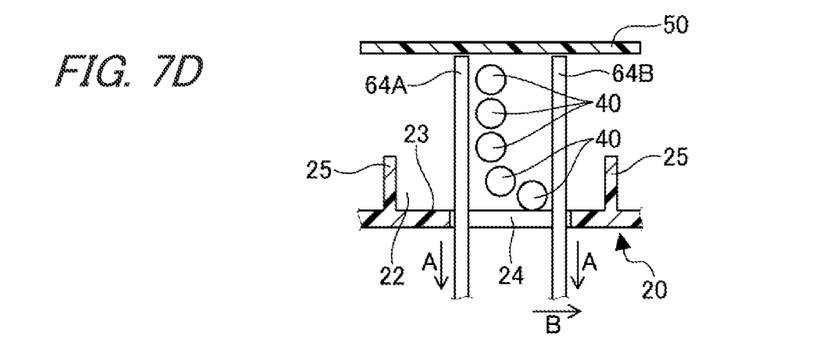

As shown in FIG. 7D, the elevation portion 62 of the electric wire routing device 60 is lowered, so that the positioning pin 67 inserted into the positioning hole 26 and the guide pins 64A and 64B inserted into the through hole 24 are pulled out downward (in a direction of arrow A in FIG. 7D). At this time, in the electric wire holding mechanism 63, the movable block 65B is moved in a direction away from the fixed block 65A (in a direction of arrow B in FIG. 7D), and the interval between the guide pins 64A and 64B is gradually widened. The cover 50 is moved downward following the guide pins 64A and 64B which are pulled out from the through hole 24 of the case 20. In this way, the electric wire 40 is arranged in a horizontal direction along the bottom portion 23 of the electric wire routing path 22 between the guide pins 64A and 64B while being held between the guide pins 64A and 64B whose interval is gradually widened.

Thereafter, the cover 50 is mounted to the upper portion of the electric wire routing path 22, and the guide pins 64A and 64B and the positioning pin 67 are arranged below the case 20. As a result, the cover 50 is mounted to the upper portion of the electric wire routing path 22, and thus the electric wire routing path 22 where the electric wire 40 is accommodated is closed.

Here, a reference example will be described.

Figure 8:
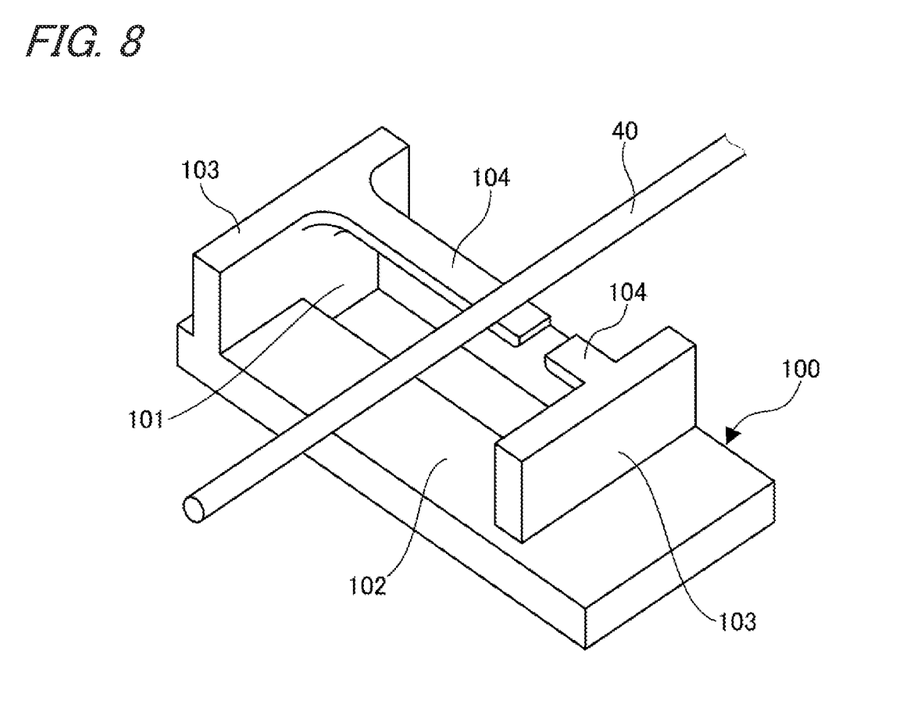
FIG. 8 is a perspective view showing a case according to a reference example.
Figure 9A:
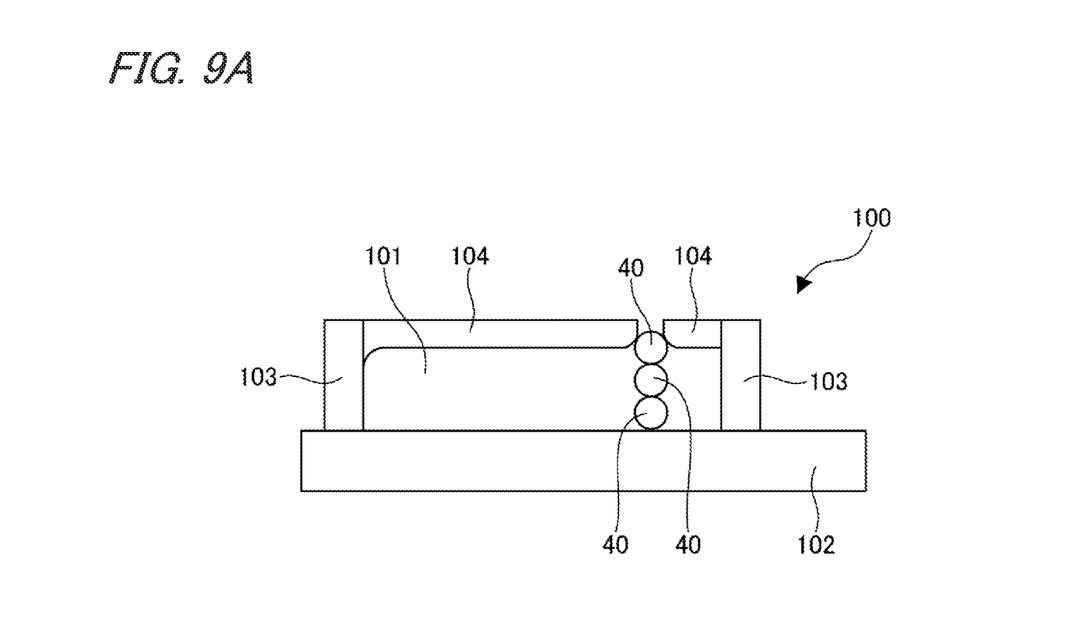
FIGS. 9A and 9B are side views showing the case, respectively.
Figure 9B:
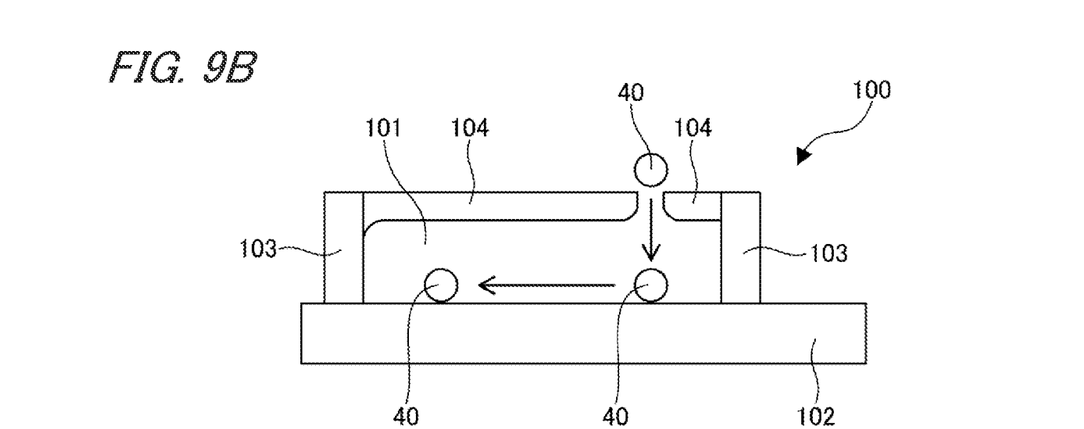

FIG. 8 is a perspective view showing a case according to the reference example. FIGS. 9A and 9B show a method of routing an electric wire to the case according to the reference example. FIGS. 9A and 9B are side views showing the case, respectively.

As shown in FIG. 8, the reference example is a case 100 including a routing path 101 where the electric wire 40 is routed.

The case 100 includes a bottom portion 102, side wall portions 103 erected on two side portions of the bottom portion 102, and arm portions 104 which extend from upper edges of the side wall portions 103 in directions approaching each other.

In this case 100, the electric wire 40 is pushed and routed one by one from between end portions of the arm portions 104 to the routing path 101.

As shown in FIG. 9A, in the case 100, when the electric wire 40 is continuously pushed from between the arm portions 104, the pushed electric wire 40 is stacked in the up-down direction, and routing toward the routing path 101 may not be smoothly performed. Therefore, it is necessary to push the electric wire 40 one by one from between the arm portions 104 and move the pushed electric wire 40 in a width direction of the routing path 101, which causes the routing to require more effort and time. Moreover, in the case 100, since the arm portions 104 are elastically deformed when the electric wire 40 is pushed in, it is necessary to select and use a resin material that can be elastically deformed satisfactorily without being damaged, which may result in an increase in costs.

According to the method of electric wire routing according to the present embodiment, the electric wire 40 is passed between the pair of guide pins 64A and 64B which are inserted into the through hole 24, and the cover 50 is assembled to the upper portion of the electric wire routing path 22 while the guide pins 64A and 64B are pulled out from the through hole 24. As a result, the electric wire 40 can be easily routed in the electric wire routing path 22 while the electric wire 40 is prevented from escaping from the electric wire routing path 22 and prevented from being caught between the side wall portions 25 of the electric wire routing path 22 and the cover 50. Moreover, since it is not necessary to form a holding pin or the like in the case to hold the electric wire 40 in the electric wire routing path 22, an increase in a cost of the case 20 can be prevented.

In addition, insertion and removal of the guide pins 64A and 64B relative to the through hole 24, arrangement of the electric wire 40 between the guide pins 64A and 64B, and mounting of the cover 50 to the case 20 can be performed by an actuator or the like. As a result, an operation of routing the electric wire 40 to the electric wire routing path 22 of the case 20 can be easily automated.

The guide pins 64A and 64B are separated from each other when the guide pins 64A and 64B are pulled out from the through hole 24. Therefore, the electric wire 40 stacked between the guide pins 64A and 64B can be arranged along the bottom portion 23 of the electric wire routing path 22 along with pull-out of the guide pins 64A and 64B, and thus the electric wire 40 can be smoothly routed in the electric wire routing path 22. Moreover, mounting of the cover 50 to the upper portion of the electric wire routing path 22 is not hindered by the stacked electric wire 40, so that the cover 50 can be smoothly mounted to the upper portion of the electric wire routing path 22.

The routing route of the electric wire 40 is restricted by the electric wire restricting rib 27 after the guide pins 64A and 64B are pulled out. Therefore, the electric wire 40 can be easily routed in the electric wire routing path 22 while the electric wire 40 is more satisfactorily prevented from escaping from the electric wire routing path 22 and prevented from being caught between the side wall portions 25 of the electric wire routing path 22 and the cover 50.

The present invention is not limited to the above embodiment, and modifications, improvements, and the like can be made as appropriate. In addition, the material, shape, size, number, arrangement position, and the like of each component in the above embodiment can be set as desired and are not limited as long as the present invention can be achieved.

For example, the guide pins 64A and 64B to be inserted into and removed from the through hole 24 of the case 20 may have a certain length in the routing direction of the electric wire 40.

Although a case where the electric wire 40 is routed in the case 20 of the busbar module 10 is exemplified in the above embodiment, the case where the electric wire 40 is routed is not limited to the case 20 of the busbar module 10.

[1] A method of electric wire routing includes: routing an electric wire (40) in an electric wire routing path (22) which is provided in a case (20) and has a concave shape in a cross-sectional view; and covering an upper portion of the electric wire routing path (22) with a cover (50).

A pair of guide pins (64A, 64B) are inserted into a through hole (24) formed in a bottom portion (23) of the electric wire routing path (22) in the case (20) from below to a position above a side wall portion (25) which forms the electric wire routing path (22).

The electric wire (40) is passed between the guide pins (64A, 64B).

The cover (50) is assembled to the upper portion of the electric wire routing path (22) while the guide pins (64A, 64B) are pulled out from the through hole (24).

According to the method of electric wire routing having the above configuration [1], the electric wire is passed between the pair of guide pins which are inserted into the through hole, and the cover is assembled to the upper portion of the electric wire routing path while the guide pins are pulled out from the through hole. As a result, the electric wire can be easily routed in the electric wire routing path while the electric wire is prevented from escaping from the electric wire routing path and prevented from being caught between the side wall portion of the electric wire routing path and the cover. Moreover, since it is not necessary to form a holding pin or the like in the case to hold the electric wire in the electric wire routing path, an increase in a cost of the case can be prevented.

In addition, insertion and removal of the guide pins relative to the through hole, arrangement of the electric wire between the guide pins, and mounting of the cover to the case can be performed by an actuator or the like. As a result, an operation of routing the electric wire to the electric wire routing path of the case can be easily automated.

[2] In the method of electric wire routing, the guide pins (64A, 64B) may be separated from each other when the guide pins (64A, 64B) are pulled out from the through hole (24).

According to the method of electric wire routing having the above configuration [2], the guide pins are separated from each other when the guide pins are pulled out from the through hole. Therefore, the electric wire stacked between the guide pins can be arranged along the bottom portion of the electric wire routing path along with pull-out of the guide pins, and thus the electric wire can be smoothly routed in the electric wire routing path. Moreover, mounting of the cover to the upper portion of the electric wire routing path is not hindered by the stacked electric wire, so that the cover can be smoothly mounted to the upper portion of the electric wire routing path.

[3] In the method of electric wire routing, an electric wire restricting rib (27) may be formed on the bottom portion (23) of the electric wire routing path (22) of the case (20) along a routing direction of the electric wire (40) so as to restrict a routing route of the electric wire (40) after the guide pins (64A, 64B) are pulled out.

According to the method of electric wire routing having the above configuration [3], the routing route of the electric wire is restricted by the electric wire restricting rib after the guide pins are pulled out. Therefore, the electric wire can be easily routed in the electric wire routing path while the electric wire is more satisfactorily prevented from escaping from the electric wire routing path and prevented from being caught between the side wall portion of the electric wire routing path and the cover.

What is claimed is:

1. A method of electric wire routing, comprising:

routing an electric wire in an electric wire routing path which is provided in a case and has a concave shape in a cross-sectional view; and covering an upper portion of the electric wire routing path with a cover, wherein the routing the electric wire in the electric wire routing path includes, inserting a pair of guide pins into a through hole formed in a bottom portion of the electric wire routing path in the case from below to a position above a side wall portion which forms the electric wire routing path, passing the electric wire between the guide pins, and moving a first one of the pair of guide pins away from a second one of the pair of guide pins, and covering the upper portion of the electric wire routing path includes assembling the cover to the upper portion of the electric wire routing path while pulling the guide pins out from the through hole.

2. The method of electric wire routing according to claim 1, wherein moving the first one of the pair of guide pins away from the second one of the pair occurs while pulling the guide pins out from the through hole.

3. A method of electric wire routing, comprising:

routing an electric wire in an electric wire routing path which is provided in a case and has a concave shape in a cross-sectional view; and covering an upper portion of the electric wire routing path with a cover, wherein a pair of guide pins are inserted into a through hole formed in a bottom portion of the electric wire routing path in the case from below to a position above a side wall portion which forms the electric wire routing path, the electric wire is passed between the guide pins, the cover is assembled to the upper portion of the electric wire routing path while the guide pins are pulled out from the through hole, and an electric wire restricting rib is formed on the bottom portion of the electric wire routing path of the case along a routing direction of the electric wire so as to restrict a routing route of the electric wire after the guide pins are pulled out.

* * * * *